United States Patent
Travis et al.

(10) Patent No.: US 6,459,156 B1
(45) Date of Patent: Oct. 1, 2002

(54) SEMICONDUCTOR DEVICE, A PROCESS FOR A SEMICONDUCTOR DEVICE, AND A PROCESS FOR MAKING A MASKING DATABASE

(75) Inventors: Edward O. Travis; Sejal N. Chheda; Bradley P. Smith, all of Austin; Ruiqi Tian, Pflugerville, all of TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/470,873

(22) Filed: Dec. 22, 1999

(51) Int. Cl.$^7$ .............................................. H01L 23/48
(52) U.S. Cl. ....................................... 257/774; 257/775
(58) Field of Search ................................. 257/774, 758, 257/775, 797, 783; 438/629, 637, 639, 640, 667, 668, 672, 675, 700, 701, 713, 978, 638

(56) References Cited

U.S. PATENT DOCUMENTS

| | | | |
|---|---|---|---|
| 5,278,105 A | 1/1994 | Eden et al. | 437/250 |
| 5,341,026 A | * 8/1994 | Harada et al. | 257/764 |
| 5,885,856 A | 3/1999 | Gilbert et al. | 438/129 |

FOREIGN PATENT DOCUMENTS

| | | | |
|---|---|---|---|
| EP | 0 712 156 A2 | 5/1996 | H01L/21/768 |
| WO | WO 96/15552 | 5/1996 | H01L/23/053 |

OTHER PUBLICATIONS

B. Stine et al., "A Closed–Form Analytic Model for ILD Thickness Variation in CMP Processes", Proc. CMP–MIC, Santa Clara, CA, Feb. 1997, 8 pgs.

Wei Huang et al., "A Layout Advisor for Timing–Critical Bus Routing", 1997 IEEE, pp. 210–214.

Andrew B. Kahng et al., "Filling Algorithms and Analyses for Layout Density Control", IEEE Transactions on Computer–Aided Design of Integrated Circuits and Systems, vol.18, No. 4, Apr. 1999, pp. 445–462.

Andrew B. Kahng et al., "Filling and Slotting: Analysis and Algorithms", ISPD 98 Monterey, Ca USA, pp. 95–102.

Brian E. Stine et al., "The Physical and Electrical effects of Metal–Fill Patterning Practices for Oxide Chemical–Mechanical Polishing Processes", IEEE Transactions on Electron Devices, vol. 45, No. 3, Mar. 1998, pp. 665–679.

Andre' Schultz, "an Empirical Model for Planarization with Polymer Solutions", Jpn. J. Appl. Phys. Vo. 3–1 (1995) PL. 1, No. 8A, pp. 4185–4194.

George Y. Liu et al., "Chip–Level CMP Modeling And Smart Dummy For HDP And Conformal CVD Films", Proceedings of CMP–MIC Feb. 11, 1999, (8 pgs).

* cited by examiner

*Primary Examiner*—Jasmine J B Clark
(74) *Attorney, Agent, or Firm*—Kim-Marie Vo

(57) ABSTRACT

At least one process-assist feature (210, 70, 706, 806, 506, 406, 608, 904, 1106, 108, 1206, 1208) at or near a via location of a wiring structure (75, 700, 800, 500, 400, 614, 908, 1205) within a semiconductor device is used to improve processing or processing margin during subsequent processing. For at least some of the embodiments of the present invention, the process-assist features feature (210, 70, 706, 806, 506, 406, 608, 904, 1106, 1108, 1206, 1208) help to make a flowable layer more uniform over via locations (84, 74, 704, 804, 504, 404, 603, 904, 1104, 1204). Typically, this can help in the formation of via openings. When a resist layer (204) is formed over the process-assist features, the resist layer (204) will have a more uniform thickness over most via locations within the device. When an insulating layer (197) is formed over the via locations, the insulating layer (107) will have a more uniform thickness over most via locations within the device. More control during resist exposure or via opening etching allow more process margin. The embodiments described herein illustrate the flexibility in placing process-assist features.

45 Claims, 9 Drawing Sheets

SEMICONDUCTOR DEVICE, A PROCESS FOR A SEMICONDUCTOR DEVICE, AND A PROCESS FOR MAKING A MASKING DATABASE

RELATED APPLICATION

This application is related to U.S. Pat. application No. 09/340,697 filed Jun. 29, 1999, and entitled "Semiconductor Device and a Process for Designing a Mask" which is incorporated herein by reference and assigned to the current assignee hereof.

FIELD OF THE INVENTION

The present invention relates to semiconductor devices, masks, and processes for forming or designing them and, more particularly, to process-assist features located at or near via locations.

Related Art

In the semiconductor manufacture process, the various process steps and their sequence can yield non-planar topographical features of the semiconductor device. The topographical features are necessary in order to provide desired function in the device. The topographical variation caused by the features, however, can present certain problems in the semiconductor manufacturing process and also in operations of the final product semiconductor device.

These problems are particularly encountered in via locations of the device during manufacture. For example, the exposure energy and procedures to print vias must account for the greatest thicknesses of resist although resist thickness varies. This problem can result in overetch and underetch of portions on the same die because of lag problems that occur in that etch rates are slowed as the aspect ratio increases because of thicker resist. As used herein, aspect ratio of an opening is a ratio of the depth of the opening to the width of the opening.

Another problem includes "side lobing" when a phase-shifting mask is used. When radiation passes through a phase-shifting mask, a secondary peak in radiation occurs near the edge of the feature being printed in the resist. The resist requires higher levels of radiation to expose the resist at locations where the resist is thicker. However, if the radiation is too high, the secondary peak can exceed the level of energy needed to expose a pattern in the resist. Because these typically occur near the edge of a pattern, it is called "side lobing." If the minimum exposure required for the thicker resist exceeds the maximum exposure before side lobing occurs, the process will not work. The problems described above are particularly apparent in trench first, via last (TFVL) manufacture procedures, which is a process for forming dual-inlaid openings for interconnects or the like, where trenches are formed before via openings. An example of the resist thickness variation is shown in FIG. 1. In FIG. 1, a portion of a semiconductor device workpiece 100 includes an insulating layer 102 where a narrow trench 103 and a wide trench 105 have previously been formed. The semiconductor device workpiece 100 is conventional in that it includes a semiconductor device substrate (not shown in full), such as a monocrystalline semiconductor wafer, a semiconductor-on-insulator substrate, or any other substrate suitable for use to form semiconductor devices. As those skilled in the art know and appreciate, the semiconductor device substrate can comprise various layers and configurations, including active, passive, insulative, conductive and other elements, as desired in the particular case.

A resist layer 104 is formed over the insulating layer 102 and within the trenches 103 and 105. Due to the shapes and locations of the trenches, viscosity of the resist layer 104 (when coated), and other fluid mechanical properties, the resist layer 104 is not planar at its uppermost surface and has different thicknesses in the wide trench 105 and the narrow trench 103. The resist layer 104 is patterned to correspond to via locations, which are locations where vias will be formed. With increased trench width, the resist thickness in the trench decreases. For example, the thickness A of the resist 104 in the narrow trench 103 is greater than the thickness B of the resist 104 in the wide trench 105.

Openings 106 and 108 are formed within the resist layer 104 to correspond to the via locations. Before forming openings 106 and 108, the resist layer 104 is significantly thicker where resist opening 106 (e.g. approximately 2.5 microns) will be formed compared to where the resist opening 108 (e.g., approximately 1.7 microns) will be formed. In some technologies, the energy of radiation required to expose the resist layer 104 in forming the opening 106 exceeds the maximum energy before side lobing will be seen when a phase-shift mask is used.

Even if the resist openings 106 and 108 can be formed, too much etch lag may occur. After forming the resist openings 106 and 108, the insulating layer 102 is etched to form via openings that typically connect to underlying conductors (not shown). The insulating layer 102 will etch more quickly under resist opening 108 because the aspect ratio of resist opening 108 is smaller than the aspect ratio of resist opening 106. The lower aspect ratio allows etchant and etch products to enter and leave the resist opening 108 more easily compared to resist opening 106. The result is that the insulating layer 102 needs a different amount of time to remove the insulating layer under resist openings 106 and 108. Problems can include not clearing all the insulating layer 102 under the resist opening 106 or overetching the underlying conductor (not shown) that lies below resist opening 108. Even if a relatively narrow opening is formed and the insulating layer 102 is cleared from it, the relatively wider openings may become too wide while clearing the insulating layer 102.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

At least one process-assist feature at or near a via location of a wiring structure within a semiconductor device is used to improve processing or processing margin during subsequent processing. For at least some of the embodiments of the present invention, the process-assist features help to make a flowable layer more uniform over via locations. Typically, this can help in the formation of via openings. When a resist layer is formed over the process-assist features, the resist will have a more uniform thickness over most via locations within the device. When an insulating layer is formed over the via locations, the insulating layer will have a more uniform thickness over most via locations within the device. More control during resist exposure or via opening etching allows more process margin. The embodiments described herein illustrate the flexibility in placing process-assist features. The present invention is defined by the claims and is better understood after reading the description that follows.

As used herein unless otherwise stated, the terms "dense" and "density" refer to the feature (e.g., wiring structures, plugs, gate electrodes, and other active and passive elements) density of a specific area of a semiconductor device or workpiece. For example, a more dense area of a semiconductor device will have more area occupied by feature(s) located in the particular area (such as, for example, wiring structures, vias, and so forth) than a less dense area of the device (such as, for example, a trench around which there are no wiring structures or vias).

A dual-inlaid wiring structure is formed as illustrated in FIGS. 2–7. In this particular embodiment, a trench first, via last dual-inlaid process will be used to form the wiring structure. As used in this specification, a wiring structure, which is a conductor, includes an interconnect portion and a via portion. The interconnect portion routes a potential or a signal laterally within the semiconductor device, and the via portion routes a potential or a signal vertically within the semiconductor device. As used herein, a via location is the representation from a top view of where the via portion of the wiring structure lies or will be subsequently formed. Therefore, when referring to a top view of the substrate, via location and via portion can be used interchangeably.

Figure 2:
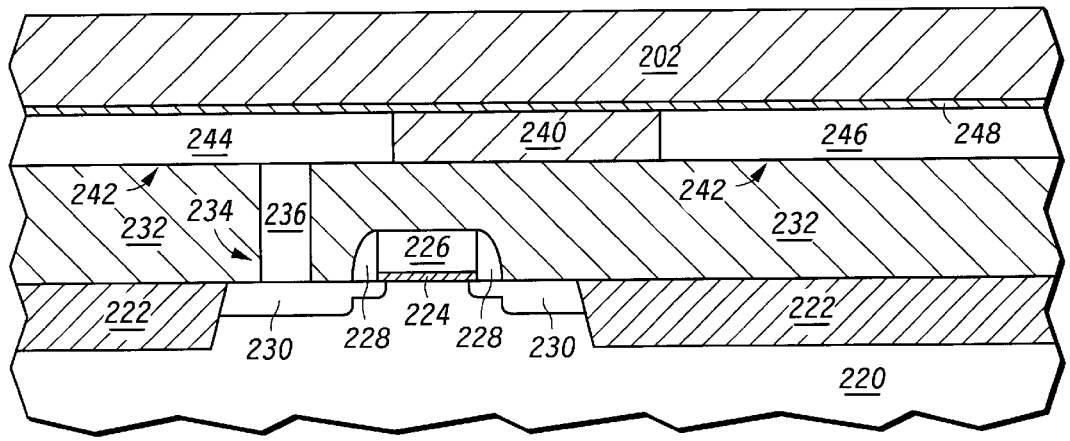
FIGS. 2–7 include illustrations of cross-sectional views of a portion of a semiconductor device formed in accordance with an embodiment of the present invention.

FIG. 2 includes an illustration of a portion of semiconductor device workpiece 220, which can include a monocrystalline semiconductor substrate, a semiconductor-on-insulator substrate, or any other substrate used for forming semiconductor devices. Field isolation regions 222 and doped regions 230 are formed within or from portions of the workpiece 220. The doped regions are source, drain, or source/drain regions (current carrying electrodes). A gate dielectric layer 224 and a gate electrode (control electrode) 226 overlie portions of the doped regions 230 and a portion of the workpiece 220 lying between the doped regions 230. Sidewall spacers 228 are formed along sides of the gate dielectric layer 224 and gate electrode 226.

A first interlevel dielectric (ILD) layer 232 is formed over the workpiece 220 and gate structure for the transistor illustrated. The first ILD layer is patterned to form an opening 234 that includes a conductive plug 236. A second insulating layer 240 is formed and patterned to include interconnect trenches 242. A conductive layer is deposited over the insulating layer 240 and within the trenches 242. A planarization act, such as chemical-mechanical polishing, is performed to remove portions of the conductive layer lying outside the trenches 242 to form the interconnects 244 and 246 as shown in FIG. 2. The interconnects 244 and 246 make electrical connections to other portions (not shown) of the semiconductor device. An etch-stop or capping layer 248 is formed over the interconnects 244 and 246. A second ILD layer 202 is formed over the etch-stop layer 248.

The first ILD layer 232, insulating layer 240, and second ILD layer 202 typically include at least one film of an oxide, nitride, oxynitride, or low-k material, which has a dielectric constant no greater than approximately 3.8. The etch-stop or capping layer 248 typically includes a material different from second ILD layer 202 to allow endpoint detection or a copper diffusion block of a process used when etching through second ILD layer 202. The conductive plug 236 and interconnects 244 and 246 include mostly doped silicon, tungsten, aluminum, copper, or the like. As used herein, mostly means at least half. Therefore, at least half of the conductive plug 236, and interconnects 244 and 246 are one of the materials previously listed. Typically, conductive plug 236 and interconnects 244 and 246 include an adhesion or barrier film. Layer 248 can be a capping layer to reduce the likelihood that copper within interconnects 244 and 246 will migrate into the workpiece 220. The process to form the semiconductor device to this point in the process is conventional.

Figure 3:
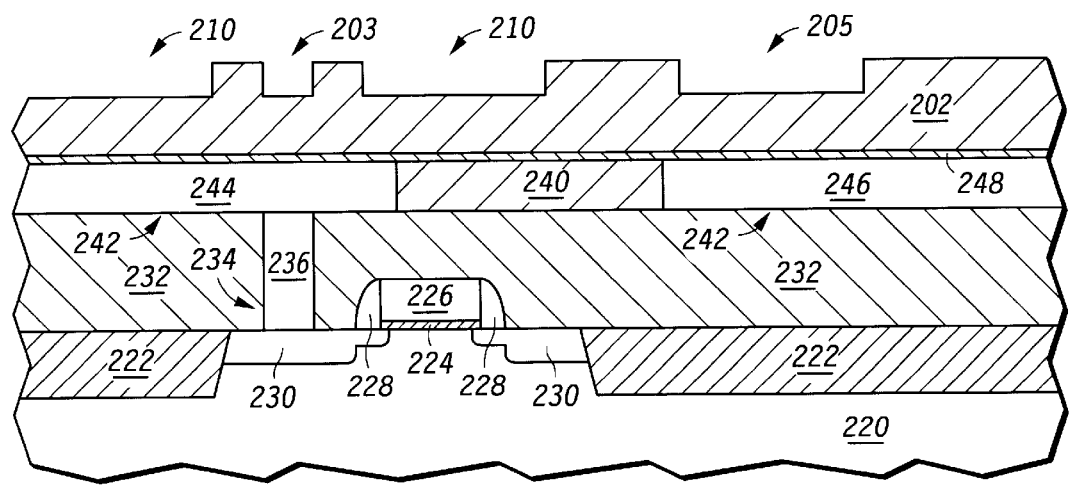

The second ILD layer 202 is patterned in conventional manner and includes trenches 203 and 205 as shown in FIG. 3. The trenches 203 and 205 correspond to regions where interconnect portions of wiring structures will be formed. The length of the trenches 203 and 205 extend into or out of FIG. 3 as illustrated. Trench 203 has the minimum width and trench 205 has the maximum width of all trenches formed at the same level with trenches 203 and 205. In a non-limiting example, trench 203 has a width of approximately 0.8 microns, and trench 205 has a width of at least 5.0 microns. Clearly, the width of the trenches 203 and 205 can be wider or narrower. For example, the width of trench 203 can be narrower than approximately 0.3 microns, and the width of the trench 205 can be wider than approximately 11.0 microns.

Figure 1:
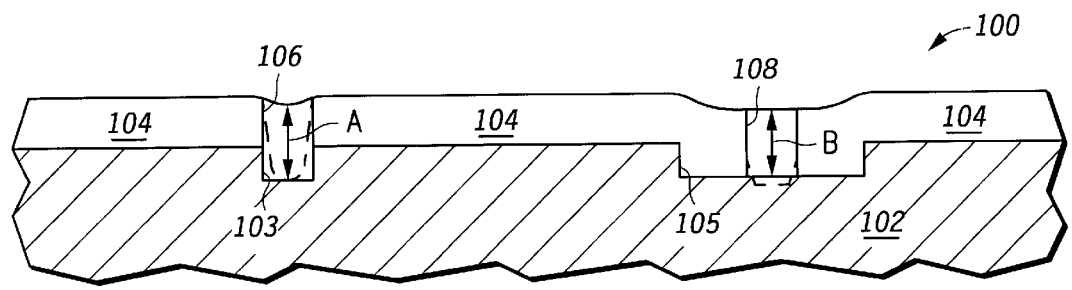
FIG. 1 includes an illustration of a cross-sectional view of a prior art semiconductor device substrate having an ILD layer with trenches, and a resist layer formed on the ILD layer and within the trenches.

Trenches 203 and 205 are similar to the trenches 103 and 105 as discussed with respect to FIG. 1. However, unlike the prior art, a process-assist feature 210 has been added to the layout. The presence of the process-assist feature 210 does not significantly affect the processing (printing and etching processes) used to form trenches 203 and 205. In this specific embodiment, the process-assist feature 210 includes a trench near an end of trench 203 and laterally surrounds trench 203 along three of its sides. More details on the shape and dimensions of the process-assist feature will be discussed later.

Figure 4:
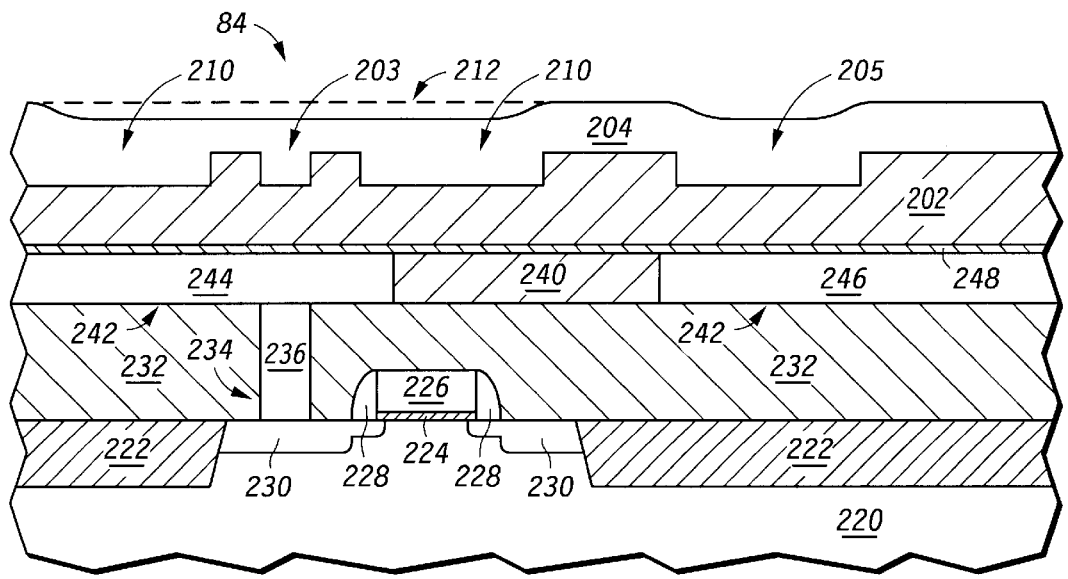

An optional adhesion layer (not shown in detail) and a lithographic resist layer 204, which is typically coated as a flowable film, are formed atop the insulating layer 202 and within trenches 203 and 205 and process-assist feature 210 as shown in FIG. 4. The process-assist feature 210 helps to reduce the thickness of the resist layer 204 within and near the trench 203, an end of which corresponds to via location 84. Phantom line 212 illustrates the resist layer 204 if the process-assist feature 210 was not present, as has been the case in the prior art illustrated in FIG. 1.

Figure 5:
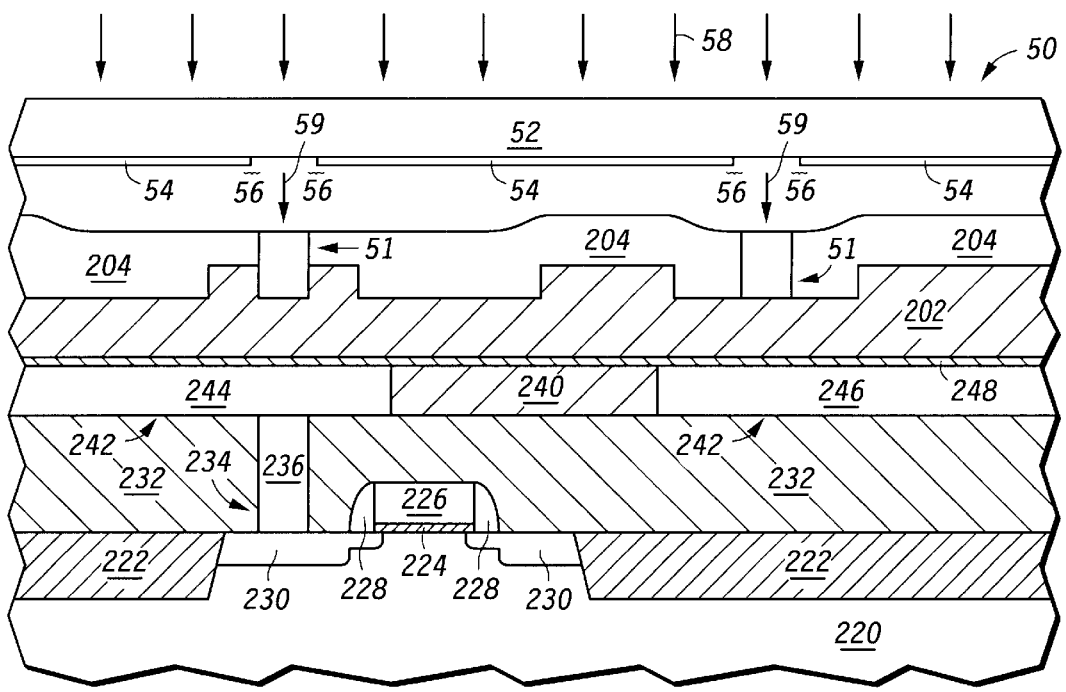

The resist layer 204 is patterned using a mask 50 that includes a transparent substrate 52, such as quartz or the like as shown in FIG. 5. In one embodiment, the elements 54 are molybdenum silicide. Elements 54 are attenuators that allow approximately 5–10 percent of the radiation intensity to reach the resist layer 204. The mask has phase shifting regions 56 that corresponds to locations under which at least some destructive interference occurs because at least some radiation passes through the elements 54. Radiation 58 is used to expose selectively the resist layer 204. Under typical conditions, no significant radiation passes through the elements 54 and near the phase shifting regions 56. At other areas further from the phase shifting regions 56, radiation 59 passes and exposes regions 51 within the underlying resist layer 204. The exposed regions 51 correspond to via locations, under which via portions of the wiring structures will subsequently be formed. In this embodiment, positive-acting resist is used. In another embodiment, negative-acting resist can be used, and the mask 50 will need to have the pattern adjusted for the negative-acting resist. The principles for using positive-acting and negative-acting resist and mask adjustments for them are known to skilled artisans.

Because the resist layer 204 has a more uniform thickness within trenches 203 and 205, the amount of radiation needed to expose the resist layer 204 within the trenches 203 and 205 is closer the same amount. The more uniform thickness increases processing margin in that the minimum radiation needed to expose the resist layer 204 within trench 203 is lower than it would be for trench 103 in FIG. 1. The likelihood of side lobing, which may occur with higher radiation levels when using a phase-shifting mask, is significantly reduced. The resist layer 204 is developed after exposure to remove the exposed portions 51 of the resist layer 204. The more uniform thickness of the resist layer 204 makes the aspect ratio of the resist openings more uniform across the workpiece. Therefore, the severity of etch lag and other etch-related problems is significantly reduced compared to the prior art as illustrated in FIG. 1. Also, variation of dimensions for the openings is reduced.

Figure 6:
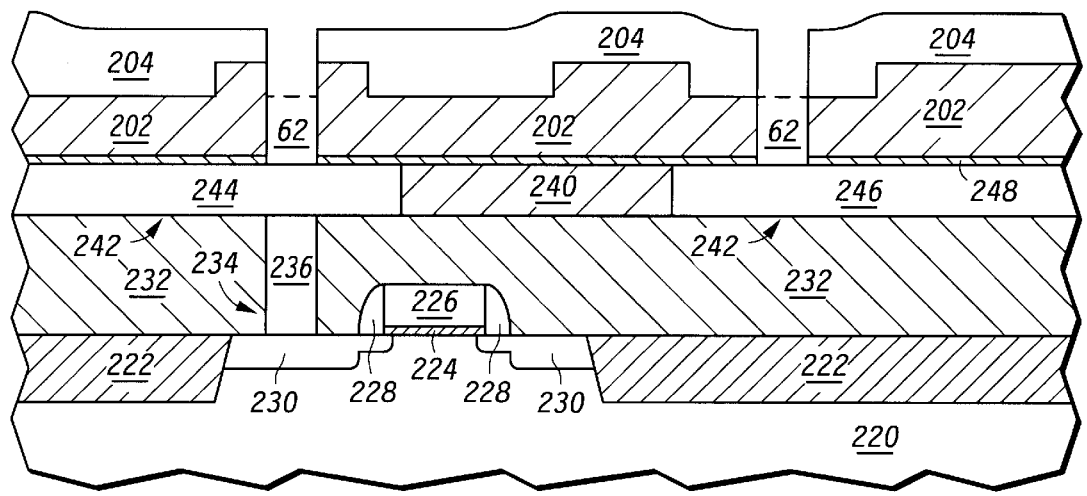

The second ILD layer 202 and layer 248 are sequentially etched to define openings 62 as shown in FIG. 6. Portions of interconnects 244 and 246 are exposed along the bottom of the openings 62. The dashes lines illustrate the level of the bottom of trenches 203 and 205, which correspond to the border between the interconnect and via portions of the subsequently formed wiring structures. The resist layer 204 is then removed.

Figure 7:
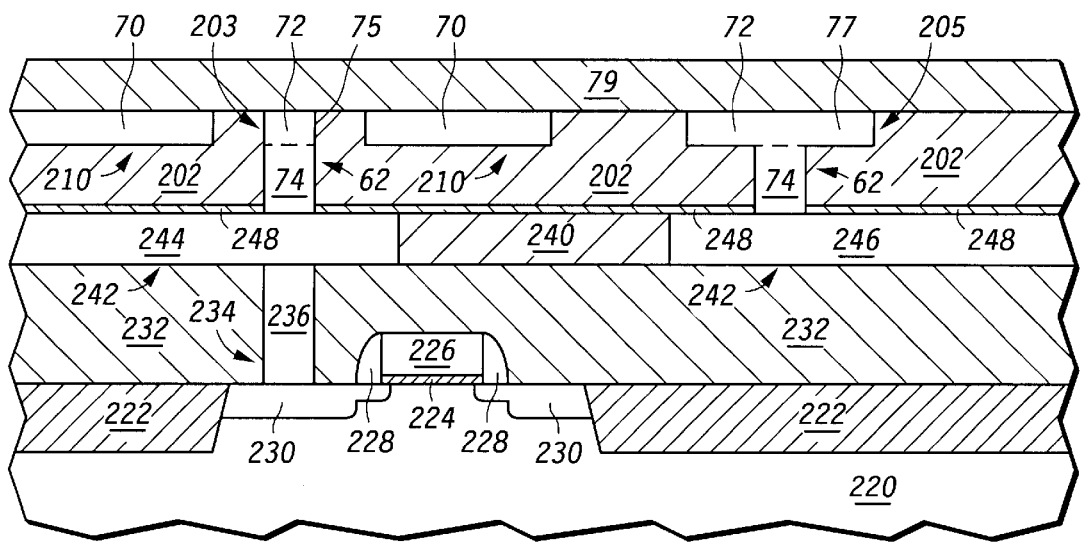

At least one conductive film is formed over the insulating layer 202 and completely fills the openings 62, trenches 203 and 205, and process-assist feature 210. A planarization act, such as chemical-mechanical polishing, is performed to remove portions of the conductive film(s) lying outside the openings 62, trenches 203 and 205, and process assist feature 210 as shown in FIG. 7. Electrically floating conductor 70 is formed within process-assist feature (trench) 210. Wiring structures 75 and 77 are formed within trenches 203 and 205 and openings 62. Each of the wiring structures 75 and 77 is a dual-inlaid, conductive structure and includes an interconnect portion 72 and a via portion 74. The dashed lines in wiring structures 75 and 77 illustrate the dividing line between the interconnect portions 72 and the via portions 74. A passivation layer 79 is formed over the insulating layer 202 and wiring structures 75 and 77 to form a substantially completed semiconductor device.

Although not shown, other electronic components are formed, and electrical connections are made to them, such as the gate electrode 226 and other doped region 230. If needed, other ILD layers and levels of wiring structures can be added. Those other ILD layers and levels of wiring structures are formed using processes similar to those described for the second ILD layer 202 and wiring structures 75 and 77.

Figure 8:
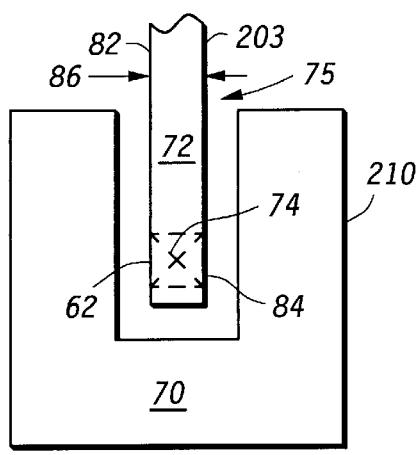
FIG. 8 includes an illustration of a top view of an embodiment of a process-assist feature near a via location of a wiring structure as formed in FIGS. 2–7.

FIG. 8 includes a top view of the wiring structure 75 and the electrically floating conductor 70, which is a collar-shaped feature that laterally surrounds the via portion 74 (shown by the boxed "X" within the wiring structure 75) along three of its sides. The interconnect portion 74 is formed within interconnect trench 203, and the via portion 74 is formed within the opening 62 that were previously described. The interconnect portion 72 has a thickness (extending into the page of FIG. 8) and a minimum width 86, as seen in the top view. The thickness corresponds to the depth of the trench 203. In one particular embodiment, the thickness is approximately 0.6 micron and the minimum width 86 is approximately 0.8 micron. Clearly, other thicknesses and minimum widths are possible.

An external length and width of the collar-shaped feature 70 can each be such that an outer boundary of the collar-shaped feature 70 lies a distance from the via portion 74, wherein the distance is no greater than approximately 100 microns or approximately 150 times the thickness or the minimum width 82 of the interconnect portion 72 near the collar-shaped feature 70. Many other dimensions may be used for the distance including approximately 50, 20, or 9 microns, or alternatively, approximately 50 times, 30 times, or 15 times the thickness or the minimum width 86 of the interconnect portion 72 near the collar-shaped feature 70. The external, lateral dimensions of the collar-shaped feature 70 are typically no smaller than approximately 3 microns.

Internal dimensions of the collar-shaped feature 70 adjacent the via portion 74 are such that the collar-shaped feature 70 is spaced apart from the wiring structure 75 by a distance no greater than approximately 10 microns or approximately 15 times the thickness or the minimum width 86 of the interconnect portion 72 near the collar-shaped feature 70. Similar to the external dimensions, many other values may be used for the internal dimensions including approximately 5 or 2 microns, or alternatively, approximately 9 times, 4 times, 2 times or 1.5 times the thickness or the minimum width 86 of the interconnect portion 72 near the collar-shaped feature 70.

In this particular embodiment, the collar-shaped feature 70 is an example of a single process-assist feature. At least one side of the collar-shaped feature 70 has a side dimension, as seen by a top view, that is typically at least approximately 3 microns but no greater than approximately 100 microns. Similar to the other aspects of the process-assist feature, other dimensions may be used. For example, in other designs, the side dimension can be in a range of approximately 6–30 microns. In one specific embodiment, the side dimension is 20 microns.

Attention is now directed to the thickness of resist layer 204 (FIG. 4) with respect to locations of the collar-shaped feature 70 as illustrated in FIG. 8. To aid in understanding the relationship between FIGS. 4 and 8, the collar-shaped feature 70 corresponds to trench 210, and the interconnect portion 72 corresponds to trench 203. The resist layer 204 has a first thickness at location 84, which is outside and immediately adjacent to trench 203 at a via location (via portion 74) and has a second thickness at location 82. Location 82 is outside and adjacent trench 203 and at least approximately 50 microns from the nearest via location (including via location corresponding to via portion 74) or another interconnect. The first thickness is typically no greater than approximately 95 percent of the second thickness and often is no greater than approximately 92 percent of the second thickness. In still other embodiments, the first thickness may be no greater that approximately 89 percent, or even approximately 85 percent, of the second thickness. The distance between the measuring points can be much larger (e.g., approximately 90 microns apart).

With respect to the second thickness, as the distance from the nearest via location or another interconnect increases beyond approximately 50 microns, for example, approximately 90 microns, the difference between the first and second thicknesses should not significantly change. Process-assist features are most needed for isolated vias (no more than a few vias approximately 50 microns from other vias and interconnects), and are least needed for multiple vias for buses or power supply wirings.

Figure 9:
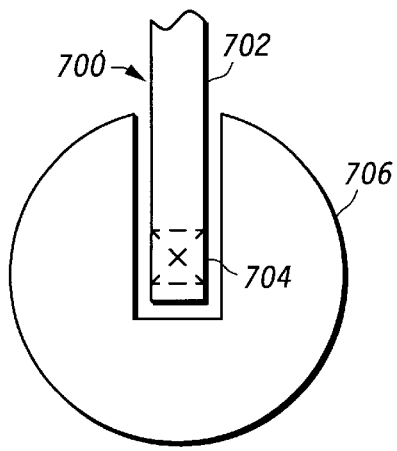
FIGS. 9–12 include illustrations of top views of alternative embodiments of process-assist feature(s) near via locations.

Alternative embodiments can be used. Referring to FIG. 9, a wiring structure 700 includes an interconnect portion 702 and a via portion 704 similar to the wiring structure 75 previously described. An arc-shaped process-assist feature 706 is used instead of the rectilinear process-assist feature 210 as seen in FIG. 8. The arc-shaped process-assist feature 706 has a center point located within the via portion 704 (as seen by a top view) and laterally surrounds at the via portion 704 along three sides. Most of, if not all, the dimensions previously described with respect to process-assist feature 210 also apply to the process-assist feature 706.

Figure 10:
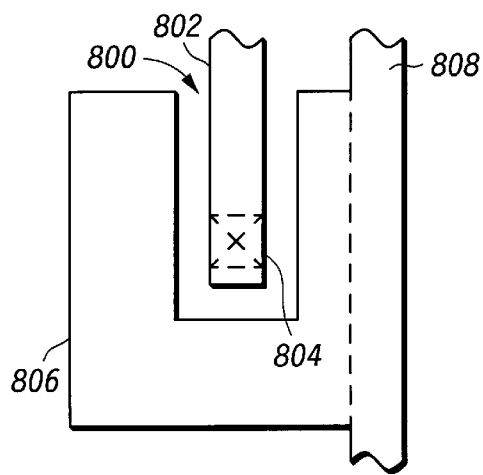

Referring to FIG. 10, a process-assist feature 806 is a collar-shaped structure that is an extension of an adjacent wiring structure 808 near a wiring structure 800. The wiring structure 800 includes an interconnect portion 802 and a via portion 804. The collar-shaped structure 806 surrounds three sides of the via portion 804. The adjacent wiring feature 808 is, for example, grounded, at another power supply potential, or electrically connected to active circuitry. The border of the process-assist feature 806 is illustrated by the dashed line shown in FIG. 10. In effect, the process-assist feature 806 includes a lateral extension from the interconnect portion of the wiring structure 808. There are no contacts or other conductive or intentional electrical purposes for the process-assist feature 806. Dimensions of the collar-shaped structure 806 are substantially the same as those of other embodiments of process-assist features, except that the collar-shaped structure 806 can vary somewhat in at least one outer boundary dimension to the extent necessary for the collar-shaped structure to be formed as an extension of the adjacent wiring structure 808.

Figure 11:
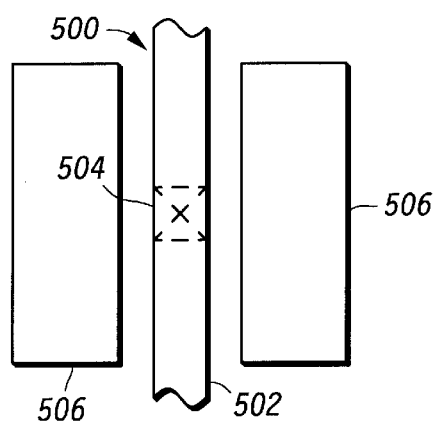

Referring to FIG. 11, process-assist features 506 are dual structures disposed on each of two opposite sides of a wiring structure 500 near a via portion 504 of the wiring structure 500. The via portion 504 is located at an intermediate location of the interconnect portion 502, rather than at a distal end as described in the previous figures. The dual structures 506 are located on each side of the wiring structure 500 and have dimensions (outer dimension and spacing from the via portion 504) similar to embodiments previously described. Alternatively, the dual structures 506 can be an extension of the wiring structure 500 (similar to that described with respect to FIG. 12 below) or a part of adjacent wiring features (not shown) as an extension. If another wiring structure (not shown) would lie near the a side of wiring structure 500, the structure 506 lying along that side may not be needed or may be placed along that other wiring structure such that the sequence of items would be a first process-assist feature 506, wiring structure 500, other wiring structure, and a second process-assist feature 506.

Figure 12:
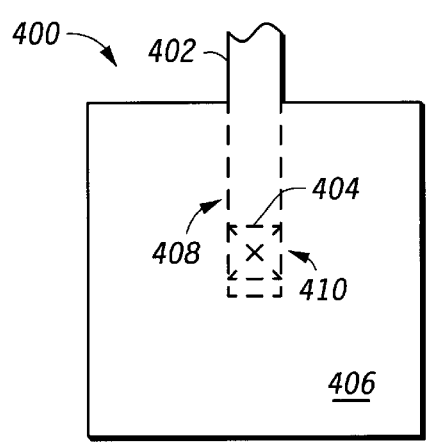

Referring to FIG. 12, an alternative process-assist feature 400 is part of an enlarged pad feature 406. The enlarged pad feature 406 is an extension of a wiring structure 400 at a via location 404. The wiring structure 400 has an interconnect portion 402 and a via portion 404. The enlarged pad feature 406 has external dimensions extending from the via location 410. The outer dimensions can be the same as those described with respect to FIG. 8. The enlarged pad 406 is similar to the collar-shaped feature 70 in FIG. 8 except that it is not spaced apart from the wiring structure 400. Dashed line 408 corresponds to the shape of the interconnect portion 402 extended to the via location 410. The enlarged pad feature 406 is formed of the same material as the wiring structure 400, such as mostly aluminum, copper or other metal, or of some other conductive material. The enlarged pad feature 406 is located within the same layer and at the same level of the semiconductor device as the interconnect portion 402.

Figure 13:
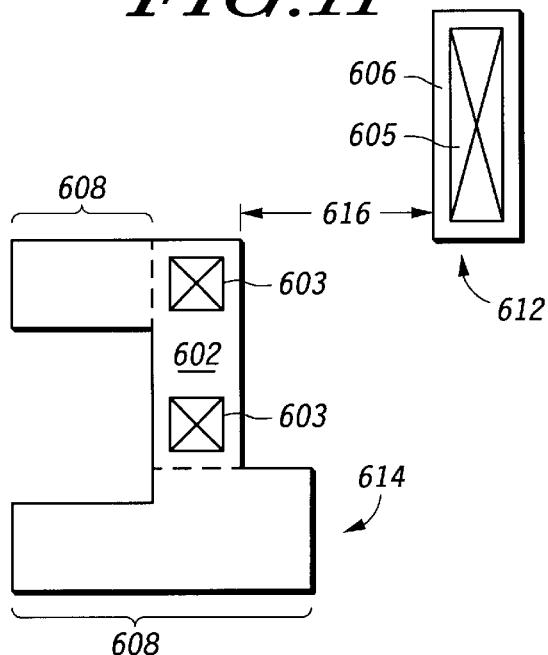
FIG. 13 includes an illustration of an embodiment of a process-assist feature at a location of several vias along a wiring structure.

Referring to FIG. 13, a wiring structure 612 is spaced apart from another wiring structure 614 by a distance 616. The distance is typically at least approximately 10 microns. In other embodiments, the distance may be approximately 20, 30, 50, or 100 microns or even more.

Wiring structure 612 includes an interconnect portion 606 and a via portion 605. As seen from the top view in FIG. 13, the via portion 605 has a lateral width and a lateral length and occupies a lateral area. In this embodiment, the lateral width is minimum lateral dimension of the lateral width and length for via portion 605. The lateral length divided by the lateral width is at least approximately two, and the value of the lateral area is at least approximately five times the value of the minimum lateral dimension. In one particular embodiment, the lateral width is approximately 0.8 micron, and the lateral length is approximately 4.0 microns. In this embodiment, a process-assist feature is not required to be placed near via portion 605, and therefore no process-assist feature lies within approximately 10 microns of the via portion 605. In other embodiments, the process-assist feature may lie 20, 30, 50, or 100 microns or even more from the nearest process assist feature.

Wiring structure 614 includes an interconnect portion 602 and via portions 603. Each of the via portions has a lateral width and a lateral length and occupies a lateral area. In this embodiment, the lateral width and the lateral length are approximately the same (e.g., 0.6 micron), and therefore, each is an example of the minimum lateral dimension for the via portions 603. For each of via portions 603, the lateral length divided by the lateral width is no greater than approximately five, and the value of the lateral area is no greater than approximately ten times the value of the lateral minimum dimension. With these dimensions, at least one process feature may be used near a via location. Process-assist features 608, which are parts of the wiring structure 614, lie within 10 microns of their nearest via portions 603. Clearly, in other embodiments, the distances between the process-assist features and the via portions can be the distances recited with respect to the spacing dimensions between the collar-shaped process-assist feature 70 and the interconnect portion 74 as discussed with respect to FIG. 8. In FIG. 13, the dashed lines in wiring structure 614 illustrates the borders between the process assist features 608 and the interconnect portion 602. The process-assist features 608 can have relatively unusual shapes and still serve their purpose. Also, similar to process-assist feature 806, process-assist features 608 serve no intentional electrical purpose; their presence in this particular embodiment is to reduce the resist thickness near the via locations where the via portions 603 will be formed.

Figure 14:
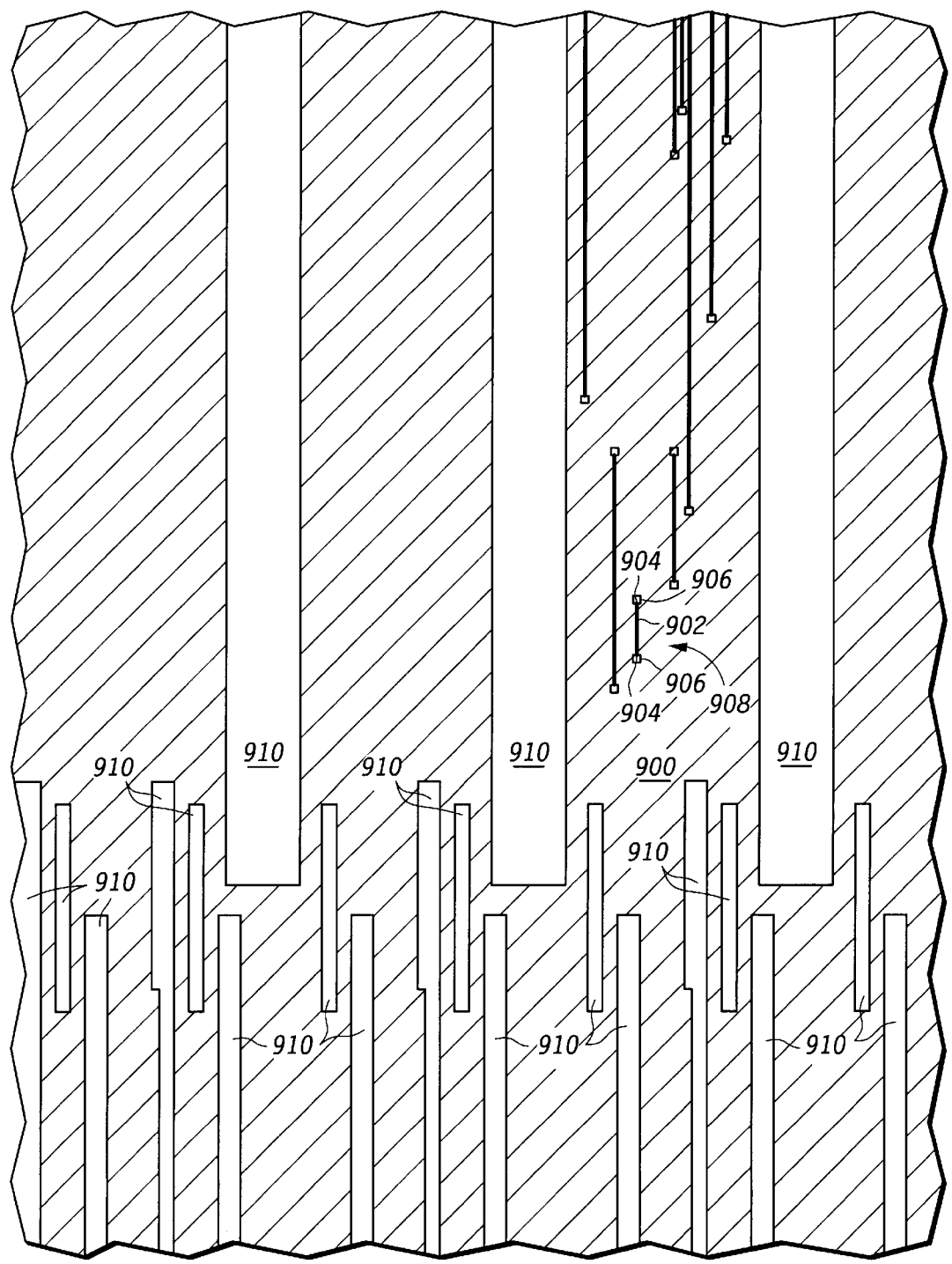
FIG. 14 includes an illustration of a top view of a semiconductor device substrate with process-assist features placed near certain of the via locations.

Application of the use of the process-assist features becomes even more apparent with the layout shown in FIG. 14. A semiconductor device substrate 900 includes wiring structures 908 and 910. Wiring structure 910 includes at least one wide wiring structure, many narrow, closely spaced wiring structures, or a combination of these. Wiring structure 910 has an interconnect width that is at least approximately four times the minimum interconnect width for all other wirings formed at the same level. Although not shown, the wiring structures 910 include many via portions. When viewing an area bounded by all points lying within approximately 20 microns of any one of the via portions of wiring structures, no process-assist feature is needed if the feature density (at the interconnect portion level) is at least approximately 10 percent. Because of each of the feature density and the interconnect width of the wiring structures 910, process-assist features are not typically used for via portions of wiring structures 910. If any would be used, they may lie near outside corners of the wiring structures 910, although none are illustrated in FIG. 14.

Isolated wiring structure 908 includes an interconnect portion 902 and via portions 904. Using the same size of area examined for feature density of wiring structures 910, the feature density isolated wiring structure, without a process-assist feature, is no greater than approximately 50 percent at the interconnect level. The interconnect width of the wiring structure 908 is no greater than approximately 20 times the minimum interconnect width for all other wirings formed at the same level. Because of each of the interconnect width and the feature density, process-assist features 906 are added to the layout at the interconnect portion level near the via portions 904, and each of the process-assist features 906 has dimensions as previously discussed. Note that the process assist features 906 are added only near the via locations and not along the entire length of the interconnect portion 902. Although not labeled, the other solid, dark, vertical lines represent other isolated wiring structures having interconnect portions, via portions, and process-assist features similar to wiring structure 908.

The process-assist features 906 in the isolated areas of the substrate 900 affect thickness of a resist (not shown in detail) when flowed over the substrate 900 in a trench of the substrate 900 in the vicinity of via portions 904. It is to be understood that the term "flowing," for purposes of the description here of manufacturing practices, includes all steps for placing material on the substrate 900, including without limitation coating, re-flowing, spin-on, or others. Furthermore, although the description here primarily addresses resist thickness and resist flowing, the same concepts of use of process-assist features to affect thicknesses can be employed in other contexts, for example, in increasing thickness uniformity of interlevel dielectrics (ILD) and other materials.

Figure 15:
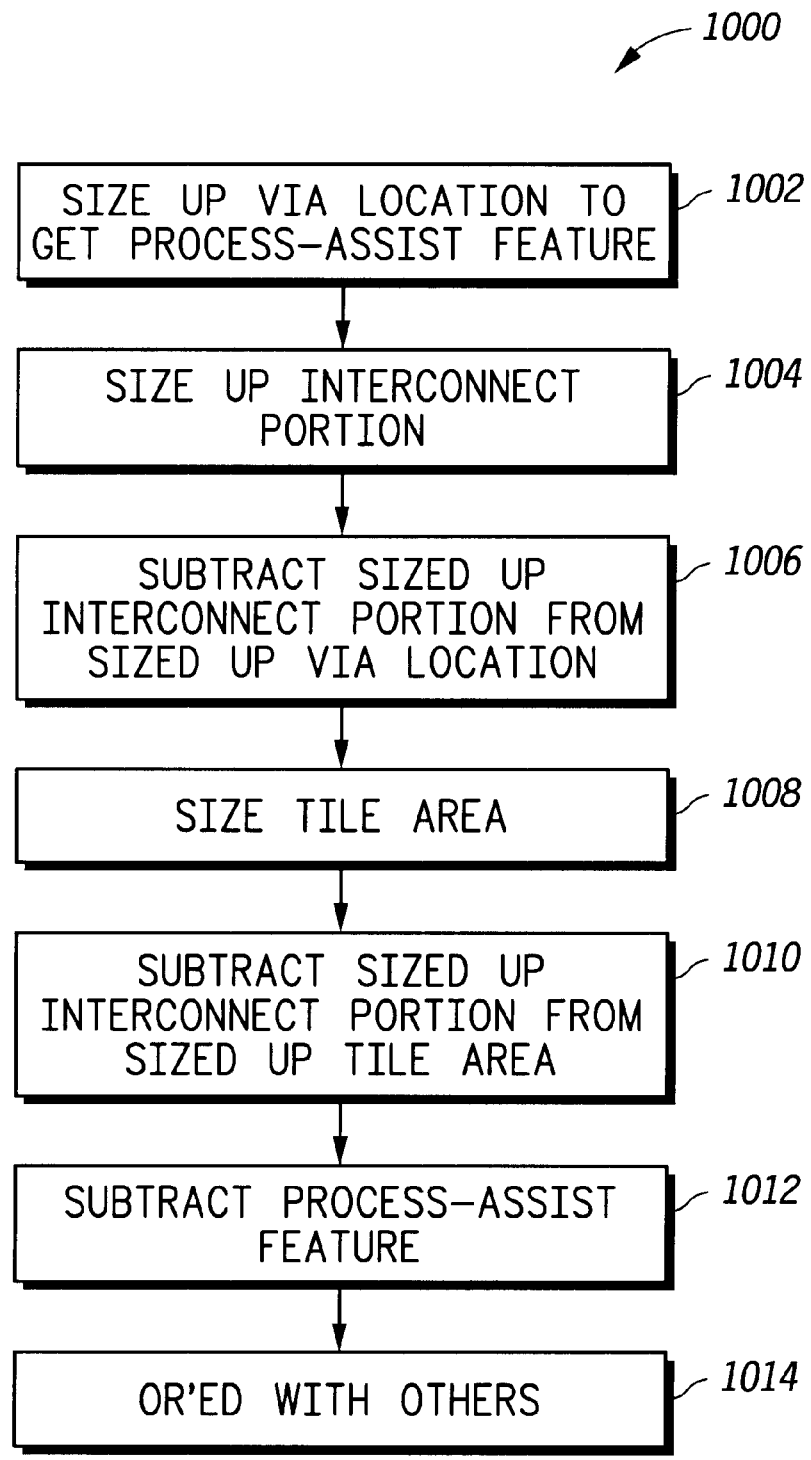
FIG. 15 includes a flow diagram of a process for performing sizing and placement of a process-assist feature according to embodiments of the present invention.

FIG. 15 includes a process flow for performing sizing at selected via locations. As discussed in relation to FIG. 14 above, many via locations do not need to be sized because they are part of buses or a high concentration of narrower wiring structures. At least half of the via locations do not need any of the process-assist features. In many embodiments, approximately 90–95 percent of all via locations do not need the process-assist features. Therefore, the method illustrated in FIG. 15 is typically used only for the most isolated of the via locations (approximately 5–10 percent of all via locations).

Referring to FIG. 15, a method 1000 is employed to locate, space, and size process-assist features at or near locations of relatively isolated via locations of wiring structures. The process-assist features can be formed as the shapes previously described or others as applicable. Additionally, the process-assist features can include tiles, or a combination of tiles and the other process-assist features. In this embodiment, both tiles and other shapes of process-assist features are used. The method 1000 commences with identification of each via location at which one or more process-assist features are warranted or desired. For each such via location, the method 1000 is performed. The method 1000 is performed, for example, in making a database for a masking level, which masking level is intended to allow formation of one or more process-assist features.

In the method 1000, a block 1002 includes a sizing up of the dimensions of a via portion at a selected via location, in order to derive maximum lateral dimensions for one or more process-assist features at or near the via location. This sizing up block 1002 can size up the via portion according to the external dimensions for the process-assist feature previously stated, for example, on the order of no less than approximately 3 microns and no more than approximately 100 microns or approximately 150 times the thickness or the minimum width of an interconnect portion associated with the via portion.

In a block 1004, the interconnect portion associated with the via portion is sized up according to the internal dimensions for the process-assist feature previously stated, for example, so that the sized up interconnect portion dimensions match internal dimensions of the process-assist feature on the order of extending the dimensions of the conductor no more than approximately 10 microns on each side or no more than approximately 4 times the thickness or the minimum width of the interconnect portion near the via portion or 4 times a minimum lateral dimension of the via location. Of course, the particular sizing up in the block 1004 will depend upon design rules, tolerances and desired effects of the process-assist feature. The block 1004 must be conformed, as necessary, to provide desired determinations for the process-assist feature. Typically, the sizing up in block 1004 is to a much smaller extent than in block 1002.

In a block 1006, the sized up interconnect portion from the block 1004 is subtracted in order that placement of features will not be made in the area of the sized up interconnect portion. This operation corresponds to making the space between a process-assist feature and the interconnect portion. Blocks 1004 and 1006 are optional if the process-assist feature is not spaced apart from the interconnect portion (e.g., wiring structure 400 in FIG. 12).

A tile area is then sized up in a block 1008. As previously mentioned, dummy structures, such as tiles, are process-assist features. Similar to the other process-assist features previously described, the tiles will be formed at the same level and using the same materials as the interconnect portions of the wiring structures. The tile area is, therefore, often a desired feature for the device and will be included in the database and the desired masking level, which can, for example, be the same database and level involved in forming the process-assist feature. Unlike prior art tiling schemes, tiling is performed only where needed, and typically, this is near isolated vias. Therefore, only selective tiling is performed. The size up block 1008 for the tile area is governed by design rules and specifications for the product semiconductor device, and will be known and understood by those skilled in the art.

The second sized up interconnect portion from the block 1004 is next subtracted in a block 1010 from the sized up tile area of the block 1008. In a next block 1012, the sized up via portion from the block 1002, which is the dimensions for the process-assist feature, is subtracted from the sized up tile area of the block 1008.

Finally, in a block 1014, the particular result for the process-assist feature, the interconnect portion, and the process-assist features including the tile area are integrated with all results obtained for masking layer features at the same masking level in an OR logical block 1014. The method 1000, including the logical block 1014, is repeated for all via locations in isolated and some semi-isolated areas of the device, in order to obtain the database for the masking level.

Figure 16:
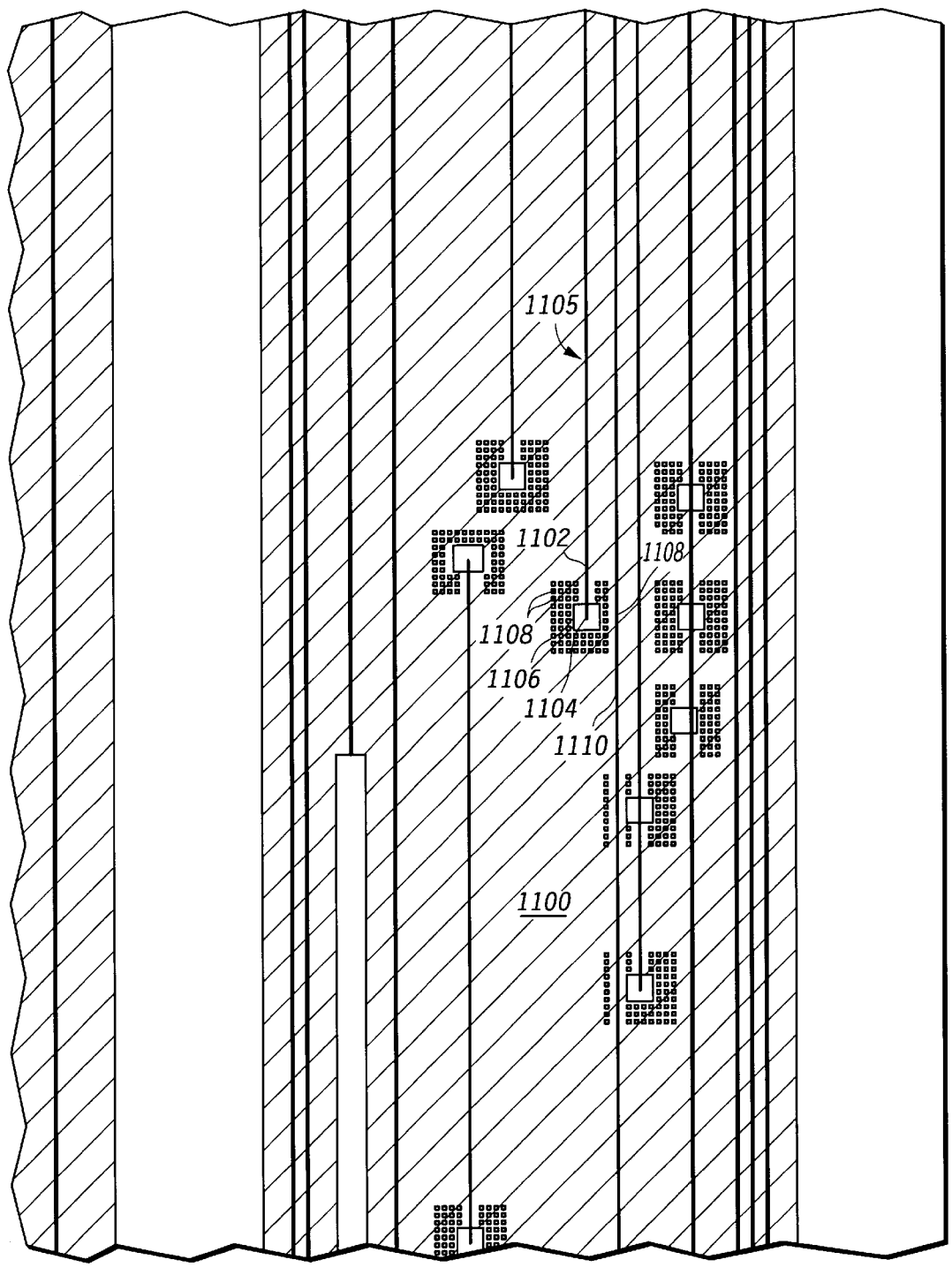
FIG. 16 includes an enlarged illustration of a top view of a semiconductor device substrate with vias located in wide trenches, wherein various process-assist features are sized and placed near the vias in accordance with the process of FIG. 15.

Referring to FIG. 16, an exemplary process-assist feature design, from a database and a masking level from the method 1000, is included in a semiconductor device substrate 1100. The process-assist features include a process-assist feature 1106 and tiles 1108. An isolated via portion 1104 and an interconnect portion 1102 are part of a wiring structure 1105. The via portion 1104 is laterally surrounded by a collar-shaped process-assist feature 1106, according to the dimension and location criteria described herein. Tiles 1108 lie within a tile area that is located adjacent to the process-assist feature 1106. In the example, the interconnect portion 1102 is distinct and spaced apart from the process-assist feature 1106, and the process-assist feature 1106 is distinct and spaced apart from the tiles 1108 of the tile area. Although not shown in FIG. 16 (due to the scale of the illustration), the process assist-feature 1106 is spaced apart from the wiring structure 1105. The database for the masking level to form these structures with these distinctions is created pursuant to the method 1000 (shown in FIG. 15).

The tile area on a right side in FIG. 16 of the process-assist feature 1106 includes fewer tiles 1108 than on other sides of the process-assist feature 1106. This is the case because of a conductor 1110 in a vicinity close to the process-assist feature 1104, which overlaps with an oversized area for the tile area. Pursuant to the logical block 1014 of the method 1000, overlapping sized-up features are integrated through the OR operation according to design rules and desired results for the masking level. The results of the OR operation are included for the database for the masking level.

As shown in FIG. 16, the placement of process-assist features, including feature 1106 and tiles 1108, is flexible. The features do not need to be symmetrically placed around a via location. Also, other wiring structures can bisect tiling patterns for adjacent wiring structures. Note that the process-assist features are typically placed near via locations, but are not needed along the entire wiring structure. A signal line (not shown) may underlie or overlie the wiring structure 1105 near the top of FIG. 16. Because there are no process-assist features at that location, there is less capacitive coupling to the signal line compared to a device that would have process-assist features along the entire length of the wiring structure. Less capacitive coupling to signal lines generally make the device operate faster.

Figure 17:
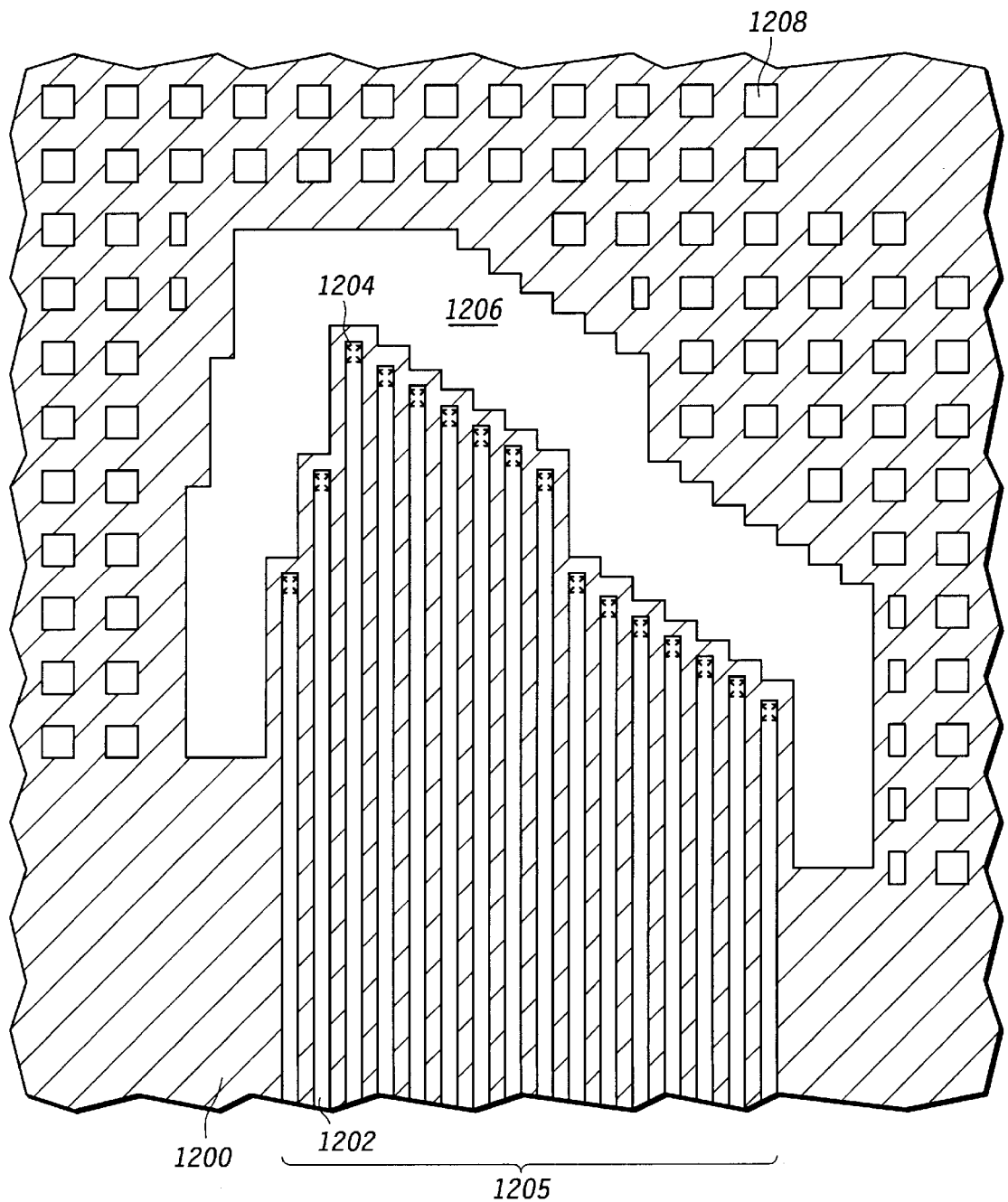
FIG. 17 includes an illustration of a top view of process-assist features and a plurality of wiring structures in an exemplary layout according to embodiments of the present invention.

Referring to FIG. 17, another exemplary process-assist feature 1206 is shown in relation to other features of a semiconductor device substrate 1200. In the example, a plurality of wiring structures 1205 include interconnect portions 1202 and terminate in a plurality of via portions 1204. Because of the close proximity of the wiring structures 1205, the single, unitary process-assist feature 1206 is located adjacent only to sides of the wiring structures 1205 near the via portions 1204 that are not adjacent other wiring structures 1205 or other features (not shown). A plurality of tiles 1208 within a tile area are located adjacent to the process-assist feature 1206 and the wiring structures 1205.

This example in FIG. 17 illustrates the integration and possible layout design for multiple features on the substrate 1200. Particularly, the method 1000 (shown in FIG. 10) allows for the integration and building of the database for the masking layer to form the multiple features. Of course, numerous other layouts, with a wide variety of possible features, including, for example, process-assist features, conductors, vias, tiles, and others, are possible following the acts of the method 1000 and the practices described herein.

Figure 18:
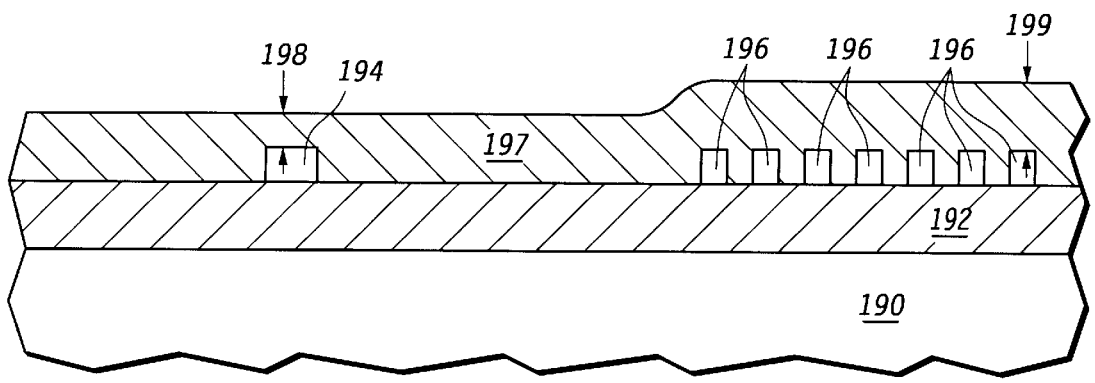
FIGS. 18 and 19 include illustrations of cross-sectional views of a semiconductor device substrate, showing an effect of adding a process assist feature during an insulating layer flowing operation.

In still other embodiments, the process-assist features near other isolated features may allow more processing margin. In this embodiment, an insulating layer is formed at least in part by performing a flowing act while previously formed conductors underlie the insulating layer. FIG. 18 includes a semiconductor device substrate 190 with a field isolation region 192 overlying the semiconductor device substrate 190. An isolated conductor 194 is formed at the same time and with the same materials as word lines 196, which are also conductors. Portions of the isolated conductor 194 and the word lines 196 include gate electrodes for transistors that are not shown in FIG. 18. The isolated conductors 194 and word lines 196 typically include silicon, a refractory metal, a refractory metal nitride, or a combination of any one or more of those materials.

An oxide layer 197 is formed over the field isolation region 192, the isolated conductor 194, and word lines 196. The oxide layer 197 is formed at least in part using a flowing act including a coating operation (spin-on) or a deposition and flowing (reflow) operation. Because no process-assist features or other features at the same level are present near the isolated conductor 194, the oxide layer 197 has a thickness 198 over the isolated conductor. The area at the word lines 196 have a higher feature density compared to the area at and near the isolated conductor 194. The oxide layer 197 has a thickness 199 that is significantly thicker than thickness 198. Subsequent formation of vias to the isolated conductor 194 and the word lines 196 will be difficult because the oxide will be removed quicker over the isolated conductor 194 compared to the word lines. This differential may cause the overetch damage to the isolated conductor 194 or electrical opens at the word lines 196 (due to the thicker oxide).

Figure 19:
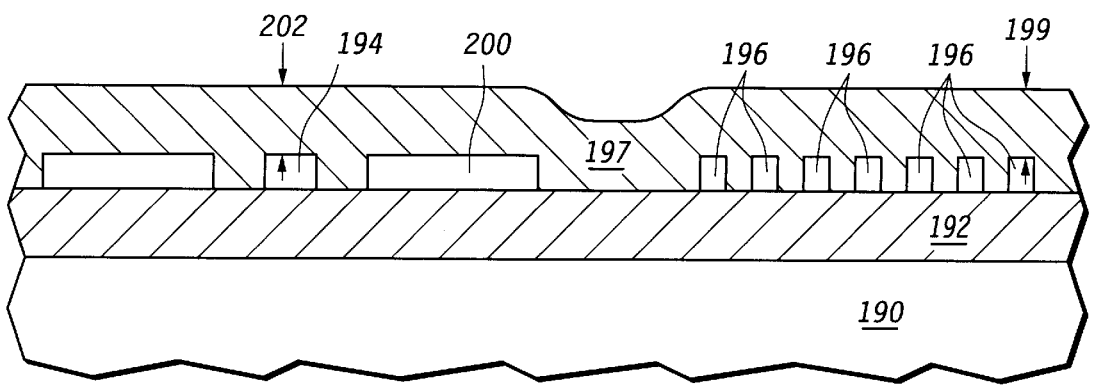

In FIG. 19, addition of process-assist feature 200 near isolated conductor 194 helps to reduce the thickness variation problem. Thickness 202 is closer to the thickness 199. Therefore, etching vias to the isolated conductor 194 and word lines 196 is more uniform between the two types of feature structures.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor device:
   a conductor having an interconnect portion and a via location, wherein the interconnect portion has a thickness and a minimum width; and
   a first set of at least one process-assist feature near the via location, wherein:
      an outer boundary of the first set lies a first distance from the via location, wherein the first distance is no greater than approximately:
         100 microns; or
         150 times the thickness or the minimum width.

2. The semiconductor device of claim 1, wherein the first distance is no greater than approximately 50 microns.

3. The semiconductor device of claim 1, wherein the first distance is no greater than approximately 20 microns.

4. The semiconductor device of claim 1, wherein the first distance is no greater than approximately 9 microns of the via location.

5. The semiconductor device of claim 1, wherein the first set of at least one process-assist feature is spaced apart from the conductor by a second distance, wherein the second distance is no more than approximately:
   10 microns; or
   15 times the thickness or the minimum width.

6. The semiconductor device of claim 5, wherein the second distance is no greater than approximately 5 microns.

7. The semiconductor device of claim 5, wherein the second distance is no greater than approximately 2 microns.

8. The semiconductor device of claim 5, wherein the second distance is no more than approximately 9 times the thickness or the minimum width.

9. The semiconductor device of claim 5, wherein the second distance is no more than approximately 4 times the thickness or the minimum width.

10. The semiconductor device of claim 5, wherein the distance is no more than approximately 2 times the thickness or the minimum width.

11. The semiconductor device of claim 1, wherein the at least one process-assist feature includes a single process-assist feature, wherein:
   the single process-assist feature has a side dimension larger than 3 microns and no greater than approximately 100 microns.

12. A semiconductor device:
   a conductor having a via location; and
   a single process-assist feature near the via location, wherein the single process-assist feature:
      has a side dimension at least approximately 3 microns and no greater than approximately 100 microns; and
      is spaced apart from the conductor by a distance, wherein the distance is no greater than approximately four times a minimum lateral dimension of the via location.

13. The semiconductor device of claim 12, wherein the single process-assist feature lies along only one side of the via location.

14. The semiconductor device of claim 12, wherein the single process-assist feature lies along at least two different sides of the via location.

15. The semiconductor device of claim 12, wherein the single process-assist feature lies along at least three different sides of the via location.

16. The semiconductor device of claim 12, wherein the single process-assist feature lies along at least four different sides of the via location.

17. The semiconductor device of claim 12, wherein the side dimension is no greater than approximately 20 microns.

18. The semiconductor device of claim 12, wherein the side dimension is no less than approximately 6 microns.

19. The semiconductor device of claim 12, wherein the distance is no greater than approximately two times a minimum lateral dimension of the via location.

20. The semiconductor device of claim 12, wherein the distance is no greater than approximately 1.5 times a minimum lateral dimension of the via location.

21. A semiconductor device:
   a first conductor has a first interconnect portion and a first via location, wherein:
      the first interconnect portion has a first interconnect width near the first via location;
      the first via location has a first lateral length, a first lateral width, and a first lateral area, which is the product of the first lateral length and the first lateral width;
      a first feature density is measured at a same level as the first interconnect portion and includes a first area bounded by points lying approximately 20 microns away from the first via portion; and
      a first process-assist feature lies at a same level as the first conductor and lies within approximately ten microns of the first via location; and
   a second conductor has a second interconnect portion and a second via location, wherein:
      the second interconnect portion has a second interconnect width near the second via location;
      the second via location has a second lateral length, a second lateral width, and a second lateral area, which is the product of the second lateral length and the second lateral width; and
      a second feature density is measured at a same level as the second interconnect portion and includes a second area bounded by points lying approximately 20 microns away from the second via portion; and
      no process-assist feature lies at the same level as the second conductor and within approximately ten microns of the second via portion,
   wherein the semiconductor device has a characteristic selected from a group consisting of:
      the first lateral length divided by the first lateral width is no greater than approximately five, and the second lateral length divided by the second lateral width is at least approximately two;

a value of the first lateral area is no greater than approximately ten times a value of a minimum lateral via dimension, and a value of the second lateral area is at least approximately five times the value of the minimum lateral via dimension;

the first interconnect width is no greater than approximately twenty times a minimum interconnect width, and the second interconnect width is at least approximately four times the minimum interconnect width; and a first feature density is no greater than approximately 50 percent, and the second feature density is at least approximately 10 percent.

22. The semiconductor device of claim 21, wherein the first lateral length divided by the first lateral width is no greater than approximately five, and the second lateral length divided by the second lateral width is at least approximately two.

23. The semiconductor device of claim 21, wherein the first lateral area is no greater than approximately ten times a minimum lateral via dimension, and the second lateral area is at least approximately five times the minimum lateral via dimension.

24. The semiconductor device of claim 21, wherein the first interconnect width is no greater than approximately twenty times a minimum interconnect width, and the second interconnect width is at least approximately four times the minimum interconnect width.

25. The semiconductor device of claim 21, wherein a first feature density is no greater than approximately 50 percent, and the second feature density is at least approximately 10 percent.

26. A process for forming a semiconductor device comprising:

forming interconnect features over a substrate, wherein:
the interconnect features include a first interconnect feature having a via location; and
the first interconnect feature near the via location is at least 50 microns away from other interconnect features at a same level; and flowing a film over the substrate and interconnect features, wherein:
the film has a first thickness over the first interconnect feature at the via location;
the film has a second thickness over the first interconnect feature spaced-apart from the via location; and
the first thickness is no greater than approximately 95 percent of the second thickness.

27. The process of claim 26, wherein the interconnect feature includes an interconnect trench and the film includes a lithographic resist.

28. The process of claim 26, wherein the interconnect feature includes a conductor formed before flowing the film and the film includes an insulating material.

29. The process of claim 28, wherein at least a portion of the film permanently remains over the substrate after flowing the film.

30. The process of claim 26, wherein measurement points for the first and second thicknesses are at least approximately 50 microns apart.

31. The process of claim 26, wherein measurement points for the first and second thicknesses are at least approximately 90 microns apart.

32. The process of claim 26, wherein the first thickness is no greater than approximately 92 percent of the second thickness.

33. The process of claim 26, wherein the first thickness is no greater than approximately 89 percent of the second thickness.

34. The process of claim 26, wherein the first thickness is no greater than approximately 85 percent of the second thickness.

35. A process for making a database for a masking level comprising:

identifying locations of a conductor having an interconnect portion and a via location, wherein the conductor includes an interconnect portion has a thickness and a minimum width; and inserting information into the database, wherein the information corresponds to a first set of at least one process-assist feature near the via location, wherein:
an outer boundary of the first set lies a first distance from the via location, wherein the first distance is no greater than approximately:
100 microns; or
150 times the thickness or the minimum width.

36. The semiconductor device of claim 35, wherein the first distance is no greater than approximately 50 microns.

37. The semiconductor device of claim 35, wherein the first distance is no greater than approximately 20 microns.

38. The semiconductor device of claim 35, wherein the first distance is no greater than approximately 9 microns of the via location.

39. The semiconductor device of claim 35, wherein the first set of at least one process-assist feature is spaced apart from the conductor by a second distance, wherein the second distance is no more than approximately:
10 microns; or
15 times the thickness or the minimum width.

40. The semiconductor device of claim 39, wherein the second distance is no greater than approximately 5 microns.

41. The semiconductor device of claim 39, wherein the second distance is no greater than approximately 2 microns.

42. The semiconductor device of claim 39, wherein the second distance is no more than approximately 9 times the thickness or the minimum width.

43. The semiconductor device of claim 39, wherein the second distance is no more than approximately 4 times the thickness or the minimum width.

44. The semiconductor device of claim 39, wherein the distance is no more than approximately 2 times the thickness or the minimum width.

45. The semiconductor device of claim 35, wherein the at least one process-assist feature includes a single process-assist feature, wherein:
the single process-assist feature has a side dimension larger than 3 microns and no greater than approximately 100 microns.

* * * * *

UNITED STATES PATENT AND TRADEMARK OFFICE
CERTIFICATE OF CORRECTION

PATENT NO. : 6,459,156 B1
DATED : October 1, 2002
INVENTOR(S) : Edward O. Travis et al.

It is certified that error appears in the above-identified patent and that said Letters Patent is hereby corrected as shown below:

<u>Title page,</u>
Item [57], ABSTRACT,
Line 2, change "108" to -- 1108 --.

Signed and Sealed this

Nineteenth Day of August, 2003

JAMES E. ROGAN
*Director of the United States Patent and Trademark Office*